United States Patent [19]

Grabbe

[11] Patent Number: 4,637,135
[45] Date of Patent: Jan. 20, 1987

[54] METHOD FOR MOUNTING A CONNECTOR TO A SUBSTRATE

[75] Inventor: Dimitry G. Grabbe, Middletown, Pa.

[73] Assignee: AMP Incorporated, Harrisburg, Pa.

[21] Appl. No.: 718,769

[22] Filed: Apr. 1, 1985

[51] Int. Cl.⁴ .............................................. H05K 3/30
[52] U.S. Cl. .................................. 29/832; 339/17 LC;
411/479
[58] Field of Search ...................... 29/832; 339/17 LC;
361/400; 411/479

[56] References Cited

U.S. PATENT DOCUMENTS

| | | | |
|---|---|---|---|
| 2,946,976 | 7/1960 | Blain | 339/17 LC |
| 3,207,954 | 9/1965 | Elliot | 361/400 X |
| 3,913,444 | 10/1975 | Otte | 411/479 |
| 4,401,355 | 8/1983 | Young | 339/17 LC X |
| 4,435,031 | 3/1984 | Black et al. | 339/17 LC X |
| 4,535,534 | 8/1985 | Ohashi et al. | 29/832 |

FOREIGN PATENT DOCUMENTS 2026790 2/1980 United Kingdom ................. 17 LC/

Primary Examiner—Mark Rosenbaum
Assistant Examiner—Carl J. Arbes
Attorney, Agent, or Firm—Donald M. Boles; Adrian J. LaRue; Bruce J. Wolstoncroft

[57] ABSTRACT

A manner of precisely mounting a surface mounting connector to a substrate is taught. Briefly stated, after soldering of the contacts of a connector to the substrate, a radially wound steel roll pin is positioned in the mounting holes of the connector housing and is then urged downwards so as to cut through the substrate. The radial forces of the roll pin are used to retain the roll pin in position in the connector housing and in the substrate, thereby rigidly holding the connector housing to the substrate upon which it is mounted.

5 Claims, 6 Drawing Figures

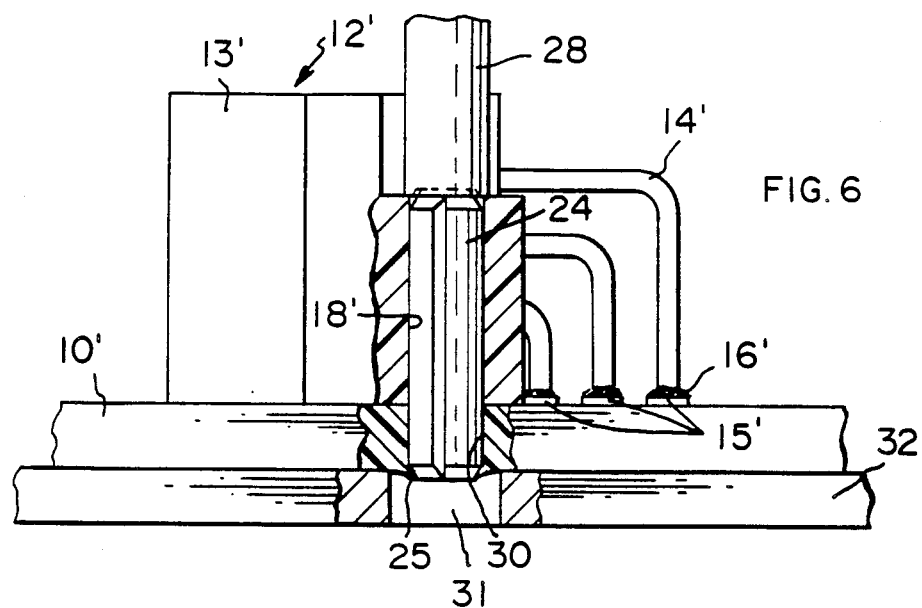

METHOD FOR MOUNTING A CONNECTOR TO A SUBSTRATE

BACKGROUND OF THE INVENTION

This invention relates, generally, to surface mounting connectors and more particularly to the mounting of a surface mounting connector housing to a substrate in a precise manner without placing mechanical stress on soldered terminals.

Recently there is an ever increasing usage of surface mounting electrical components and therefore connectors. Due to the high degree of precision required in surface mounting, automation is generally preferred to manual mounting operations. This therefore requires a high degree of precision on a circuit board with the necessity that holes which are used to secure a connector housing to a circuit board must be precisely positioned and of the correct size. This is generally where mounting problems have arisen. Installation of hardware (screws or rivets) at the time of component installation would severely impact the complexity of tooling for an automated assembly process, since not only the connector but also the mounting hardware would have to be handled. However, it is well accepted in the art that the installation of hardware has to be made in a manner that positively transfers any connector mating loads of the cable to connector, to the substrate without any stress being placed on the solder connections of the connector contacts. This is particularly problematic when cables or the like are used. Generally, this is done with ordinary hardware where holes are drilled in the substrate. This requires extreme precision to ensure that the mounting holes in the connector align with the substrate holes. If the holes of the connector and substrate do not align perfectly then upon installation of a screw or rivet or the like, displacement of the connector housing in relation to the substrate will result in an amount equal to the hole misalignment and therefore transmits stress to the solder-contact interface. Further, if screws are used then clearance in the holes is required to permit installation of the screws into the misaligned holes and the retention of the housing to the substrate will be primarily due to friction at the interface point. Further, since plastics are generally used the compressive stress of a screw will gradually relax and relative motion of the connector to the substrate will result.

It is desirable and as an object of the present invention to have a method which would guarantee perfect alignment between the connector mounting holes and the substrate mounting holes upon which it is mounted. Additionally, it is desirable and as an object of the present invention to have a method which eliminates drilling of the substrate, while it is also desirable and an object to have a method which is relatively inexpensive, easy to accomplish and which could be readily integrated into existing connector mounting procedures. Such a scheme is taught by the present invention.

Accordingly, it is desirable to have and as a further object of the present invention a method of mounting a connector to a substrate comprising the steps of (a) placing a connector having electrical contacts and at least one mounting hole aperture therein onto a substrate so as to align the contact with conductive paths disposed on the substrate; (b) inserting a pin into each mounting hole aperture in the connector; and (c) urging the pin downward so as to cut through the substrate and thereby rigidly hold the connector to the substrate.

BRIEF DESCRIPTION OF THE DRAWINGS

Reference is now made to the accompanying drawings in which:

FIGS. 4, 5 and 6 are cross-sectional views taken through connector housings showing the mounting of a connector housing to a substrate.

DETAILED DESCRIPTION OF THE PREFERRED EMBODIMENT

Figure 1:
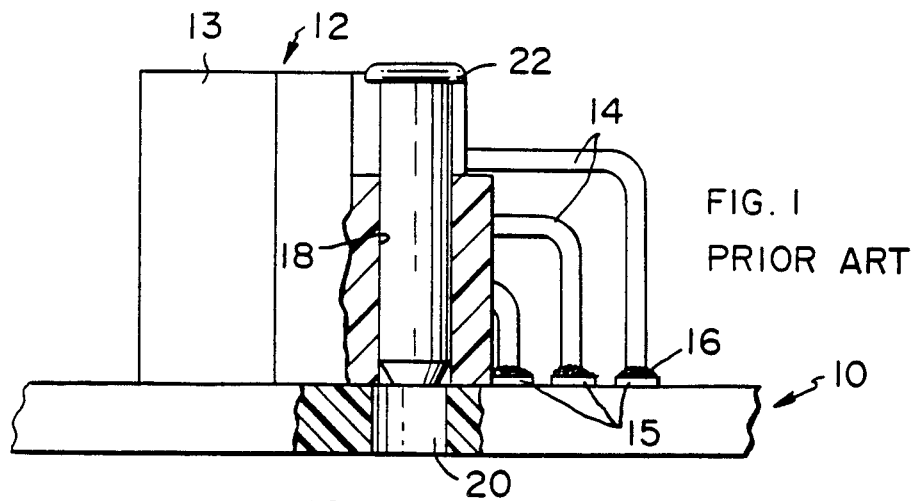
FIGS. 1 and 2 illustrate the prior art.
Figure 2:
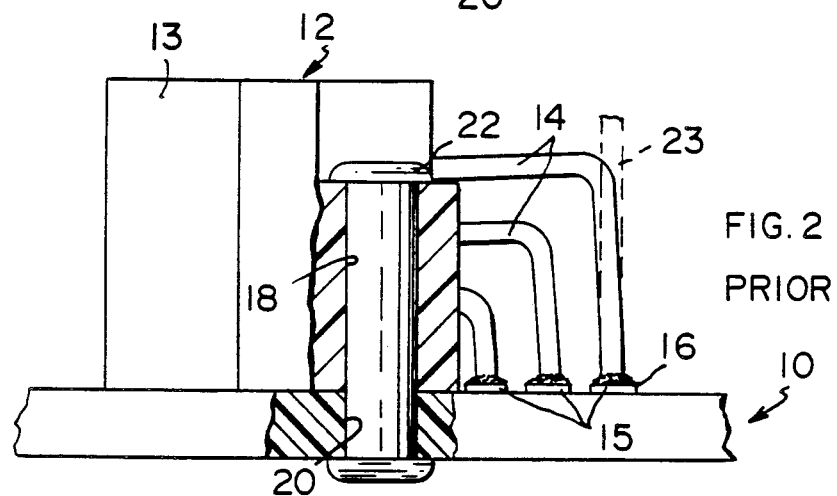

Referring now to the drawings and in particular to FIGS. 1 and 2 there can be seen the mounting of a connector housing to a substrate by use of a rivet as is presently done in the art. Shown is a substrate or circuit board 10 upon which surface mounting is accomplished. Disposed on the circuit board 10 is a connector 12 which is generally comprised of a connector housing 13 and surface mount leads 14. A solder joint is shown at 16 which attaches the leads 14 to conductive strips 15 on the substrate 10. Also shown is a connector mounting hole 18 which is disposed in the connector housing 13. By design, the connector mounting hole 18 should line up with the circuit board hole 20 which is disposed in the substrate 10. A rivet 22 is inserted through the holes 18 and 20 thereby mechanically securing the connector 12 to the substrate 10. Therefore, mating and unmating of the connector 10 is theoretically accomplished without placing strain on the solder joints 16 or the surrounding structure. However, whenever the holes 18,20 do not line up and a screw or rivet 22 or the like is used, the connector mounting hole 18 in the connector housing 13 is forced into alignment with the substrate aperture 20. The result is that the surface mount leads 14 are moved with the housing 13 thereby resulting in contact movement shown generally at 23. This therefore places a strain at the solder joint 16, either at the time of mounting the housing or subsequent thereto.

Figure 3:
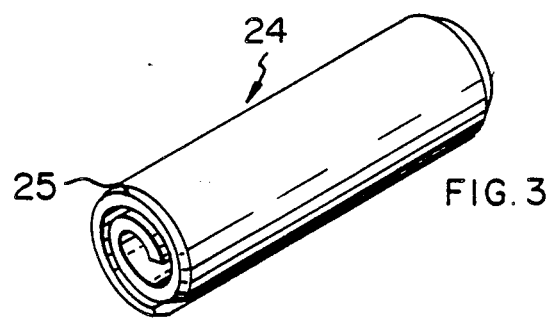
FIG. 3 is an isometric view of a roll pin for use with the present invention.

Referring now to FIG. 3 there is shown a roll pin 24 for use with the present invention. The pin 24 is preferably made out of flat spring steel which is rolled in a spiral fashion. It is to be understood, however, that other types of metal and shapes can and may be used. For example, a steel pin which would be forced into a hole or a pin with a compressible groove could be used.

Figure 4:
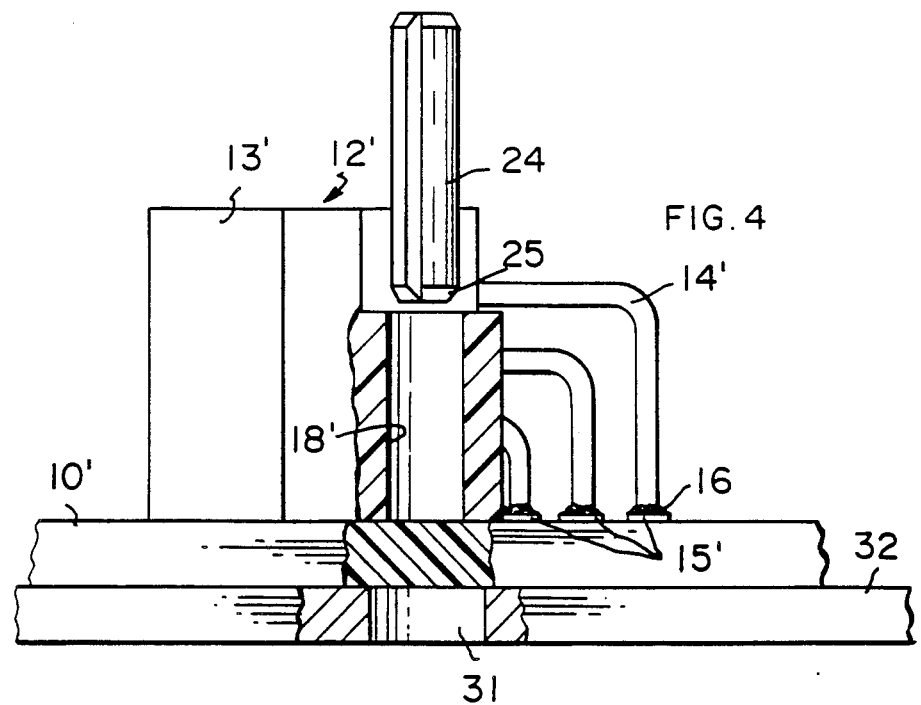
Figure 5:
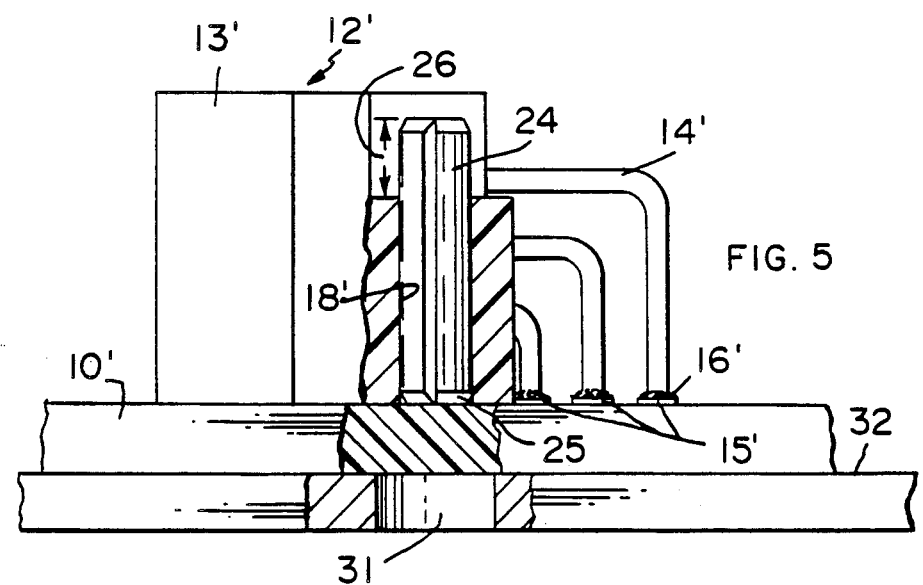

Referring now to FIGS. 4 and 5 there is shown the use of a roll pin in conjunction with the connector housing. It is to be understood that components of FIGS. 4, 5 and 6 which are similar in operation to that of FIGS. 1 and 2 will be numbered the same with the addition of a prime (') mark. Since the methodology of surface mounting is readily known to one skilled in the art, the application of the connector to the board will only be briefly described below. Generally, an adhesive is applied to the substrate 10' where a connector housing 13' is to be placed. Thereafter, that portion of the connector housing 13' which is to be adjacent the substrate 10' has applied to it a catalyst (not shown). Therefore, when the connector housing 13' is applied to the adhesive, the catalyst triggers an essentially instantaneous reaction causing the adhesive to harden and hold the connector housing 13' in place. At that point the soldering process is begun such as by solder reflow. At that point a stop or die 32 is placed under the substrate 10'. The roll pin 24 is then preferably inserted into any connector mounting holes 18' in a radially preloaded condition using standard insertion techniques readily known and available to one skilled in the art. The beveled edge 25 on the roll pin 24 aids in guiding the pin 24 into the hole 18'.

The roll pin 24 is inserted to approximately full depth of the hole 18' with a portion of the pin 24 projecting from the top of the hole 18' and which is generally shown at 26. This height 26 is slightly greater than the substrate 10' thickness. It is to be understood that the roll pin 24 could be less than fully inserted without departing from the spirit and scope of the present invention. In this manner the roll pins 24 may act as a reference for a tool in positioning of the connector 12'. Further, it is also contemplated that through proper design of the beveled edge 25 in relation to the type of connector used, the roll pin 24 need not be radially preloaded before insertion into the hole 18' with the result that the beveled edge 25 would perform the "loading" function upon insertion of the roll pin 24 into the hole 18'.

Referring now to FIG. 6 there is shown insertion of the roll pin into the substrate. An anvil or press head 28 which may simply be a stand alone arbor or a component in an automated system is used to move the roll pin 24 downward and thereby cause the beveled edge 25 of the roll pin 24 to punch through the substrate 10' and to perform a radial preloading function of the pin 24. This therefore forces out a portion of the substrate 10' forming a hole 30 and causes the bottom portion of the pin 24 to enter the die aperture 31. The anvil 28 uses the die 32 to provide reinforcement to the entire substrate 10' as well as to the area surrounding the substrate hole 30 made by pin 24. Further, due to the nature of circuit boards which are generally fiberglass, the strands of the broken fiber from around the substrate hole 30 are arranged in a "V" fashion (as shown) and therefore exert force on the pin 24 thereby prohibiting removal of the pin. Due to the radial loading of the roll pin 24, a radial force is created by the roll pin 24 against the walls of the hole 30 in the substrate 10'. In this manner absolute precise alignment of the connector 12' to the substrate 10' is accomplished since no holes need be predrilled but the connector housing 13' is instead mounted wherever the soldering of the leads 14' to conductors on the substrate 10' dictates. Therefore, the solder joint 16' cannot be stressed.

It is to be recognized that many variations of the present invention may be practiced without departing from the spirit and scope of the present invention. For example, the roll pin may be inserted into the housing before mounting of the connector to the substrate. Also, different types of connectors and/or connector housings, such that standard connectors which have contact disposal in holes in the circuit board, may be used. Further, different types of contacts may be used while the substrate may be machinable ceramic or any other suitable material.

Accordingly, the present description teaches a device which perforates the substrate in exact axial alignment and will remain in place. Further, the present device is inexpensive to utilize and cuts down on preassembly drilling operations.

What is claimed is:

1. A method of mounting a connector to a substrate comprising:
    placing a connector having electrical contacts and at least one mounting hole therein onto the substrate so as to align said electrical contacts with respective conductive paths on said substrate;
    moving a pin along a longitudinal axis of said mounting hole; and
    driving a leading end of the pin through the substrate causing the pin to be frictionally engaged with the substrate as well as an inner wall of the mounting hole thereby securing the connector to the substrate.

2. A method according to claim 1, wherein said pin is inserted into said mounting hole prior to placing the connector onto the substrate.

3. A method according to claim 1, wherein said pin is inserted into said mounting hole after the connector is placed onto the substrate.

4. A method according to claim 1, comprising an additional step of positioning a die adjacent said substrate prior to driving the pin into the substrate and supporting same.

5. A method according to claim 1, wherein said pin has a spiral configuration and is preloaded prior to being inserted into said mounting hole.

* * * * *